United States Patent [19]

Sharpe-Geisler

[11] Patent Number: 5,638,018
[45] Date of Patent: Jun. 10, 1997

[54] P-TYPE FLIP-FLOP

[75] Inventor: Bradley A. Sharpe-Geisler, San Jose, Calif.

[73] Assignee: Advanced Micro Devices, Inc., Sunnyvale, Calif.

[21] Appl. No.: 459,786

[22] Filed: Jun. 2, 1995

[51] Int. Cl.⁶ ................................................. H03K 3/356
[52] U.S. Cl. .......................... 327/215; 327/199; 327/225
[58] Field of Search .................................. 327/197, 199, 327/201, 202, 203, 208, 212, 214, 215, 218, 219, 225

[56] References Cited

U.S. PATENT DOCUMENTS

| 4,300,060 | 11/1981 | Yu ................................. | 327/197 |
| 4,716,312 | 12/1987 | Mead et al. ..................... | 307/475 |
| 4,820,939 | 4/1989 | Sowell et al. ................... | 327/203 |
| 4,825,416 | 4/1989 | Tam et al. ...................... | 365/194 |
| 4,864,161 | 9/1989 | Norman et al. .................. | 327/197 |
| 4,970,407 | 11/1990 | Patchen ......................... | 327/203 |
| 5,032,741 | 7/1991 | Smith ............................ | 307/279 |
| 5,189,315 | 2/1993 | Akata ............................ | 327/203 |

FOREIGN PATENT DOCUMENTS

| 0 318 163 | 5/1989 | European Pat. Off. . | |
| 0 330 971 | 9/1989 | European Pat. Off. . | |
| 404348609 | 12/1992 | Japan ............................ | 327/202 |
| 405327435 | 12/1993 | Japan ............................ | 327/202 |
| 406260902 | 9/1994 | Japan ............................ | 327/202 |

OTHER PUBLICATIONS

"Circuit Scheme to improve chip data hold time", Technical Disclosure Bulletin, Dec. 1990, vol. 33, No. 7, pp. 185–189.

IBM Technical Disclosure Bulletin, vol. 30, No. 4, Sep. 1987, Armonk, NY, USA (pp. 1448–1450).

Primary Examiner—Timothy P. Callahan
Assistant Examiner—My-Trang Nu Ton
Attorney, Agent, or Firm—Fliesler, Dubb, Meyer & Lovejoy

[57] ABSTRACT

A P-type flip-flop, which selectively functions in a D-type flip-flop mode or latch mode depending on its clock signal input. The P-type flip-flop has an output changing states to follow its data input at a leading edge of its clock input, the output then does not change states for a period ε, and then the output changing states to match its data input after the period ε if a signal is received at its clock input having a period greater than ε. With a pulse applied at the clock input having a width less than ε, the P-type flip-flop is edge sensitive functioning similar to a D-type flip-flop. With a pulse with longer than ε applied to the clock input, the P-type flip-flop appears transparent similar to a latch.

8 Claims, 7 Drawing Sheets

P-TYPE FLIP-FLOP

BACKGROUND OF THE INVENTION

1. Field of the Invention

The present invention relates to flip-flop and latch circuitry. More particularly, the present invention relates to circuitry which may alternatively provide the function of a latch or a D-type flip-flop.

2. Description of the Related Art

For circuitry of programmable logic devices (PLDs), field programmable gate arrays (FPGAs), microprocessors and other circuits, it may be desirable to have a circuit which at some times functions as a latch, while at other times functions as a D-type flip-flop. Although circuitry may be connected so that specific circuitry for a latch or a D-type flip-flop can be included in a signal path, the circuit which is not selected will provide a wasted resource.

FIG. 1 shows typical components utilized in a D-type flip-flop circuit. The circuitry includes two latches 102 and 104 connected in series. The /Q output of latch 102 is connected to the data input of latch 104 and the clock input of latch 102 is inverted from the clock input of latch 104 to form a D-type flip-flop.

FIG. 2 shows typical circuitry for the latches 102 and 104 of FIG. 1. As shown, the typical latch includes an inverter 200 with its output forming the /Q output of the latch. The latch also includes an inverter 202 with its output connected to the input of inverter 200 and its input connected to the Q output. Transistors in inverter 202 are further weaker than in inverter 200. A data signal is provided to the Q input of the latch 200,202 through a latch pass gate 204 which receives the clock signal at its gate.

To selectively enable provision of a latch or D-type flip-flop, additional pass gates 300 and 302 may be included in the circuitry of FIG. 2, as shown in FIG. 3. Additional pass gate 300 has its gate controlled to provide Vcc to the clock input of latch 102. This puts it in a transparent mode so that latch 104 will function as a standard latch controlled by the inverted clock signal so that it is transparent when the clock is low and will latch the data when the clock signal is high. When pass gate 302 is controlled by its gate signal to be on so that pass gate 300 is off, then the circuit functions as a standard D flip-flop because pass gate 302 will bring the clock signal to the clock input of latch 102.

Using the circuit of FIG. 3, with a latch mode selected, latches 102 provides a wasted resource, unnecessarily occupying chip space. Additional chip space is also required for pass gates 300 and 302 to enable selection of a latch or a D-type flip-flop mode of operation. Such additional circuitry is not desirable.

SUMMARY OF THE INVENTION

The present invention eliminates wasted resources on a chip, and reduces chip space required when providing a circuit which selectively operates as a latch or a D-type flip-flop.

The present invention defines a P-type flip-flop. A P-type flip-flop is defined by the present invention as a device having an output changing states to follow its data input at a leading edge of its clock input, the output then does not change states for a period $\epsilon$, and then the output changes states to match its data input after the period $\epsilon$ if a signal is received at its clock input having a period greater than $\epsilon$.

To provide a D-type flip-flop mode of operation, a pulse generator having a pulse period $\delta$, where $\epsilon > \delta$, may be utilized to provide the clock input for the P-type flip-flop. The P-type flip-flop will thus appear edge sensitive, and otherwise its Q output will not change. The P-type flip-flop, therefore, will function similar to a D-type flip-flop.

To provide a latch mode of operation, a signal having a period longer than $\epsilon$ may be applied so that the P-type flip-flop appears transparent for a duration longer than the edge of a clock signal, similar to a latch.

BRIEF DESCRIPTION OF THE DRAWINGS

Further details of the present invention are explained with the help of the attached drawings in which.

DETAILED DESCRIPTION

Figure 1:
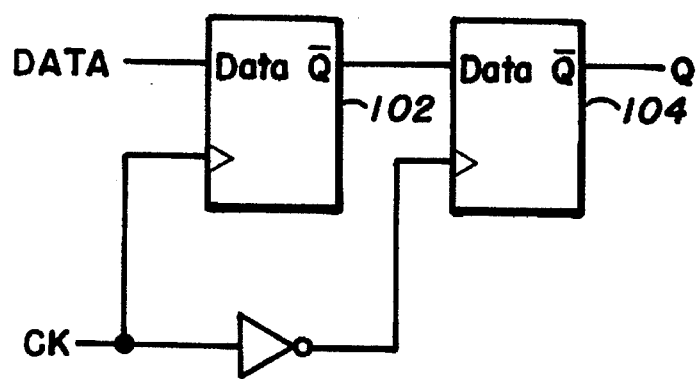
FIG. 1 shows typical components utilized in a D-type flip-flop circuit.
Figure 2:
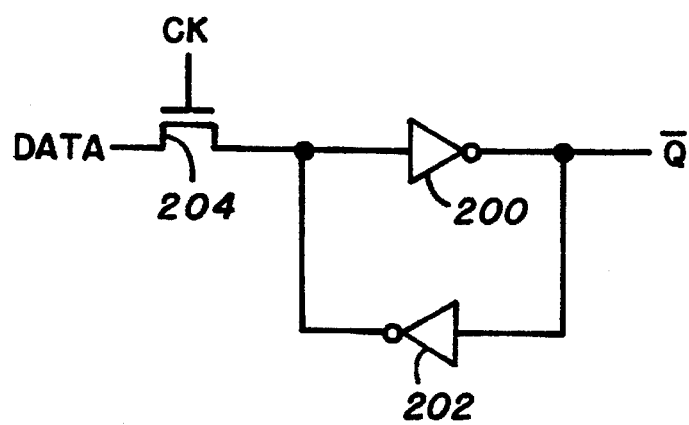
FIG. 2 shows typical circuitry for the latches of FIG. 1.
Figure 3:
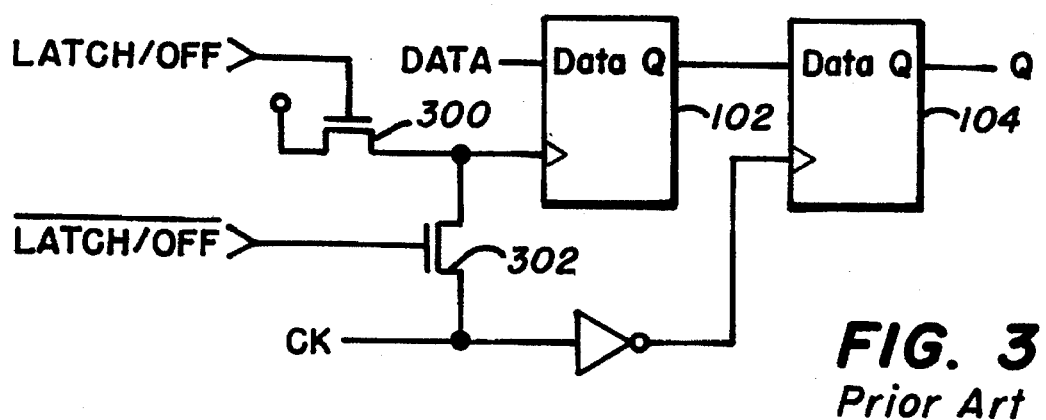
FIG. 3 shows additional circuitry which may be added to the circuit of FIG. 1 to selectively enable provision of a latch or D-type flip-flop mode of operation.
Figure 4:
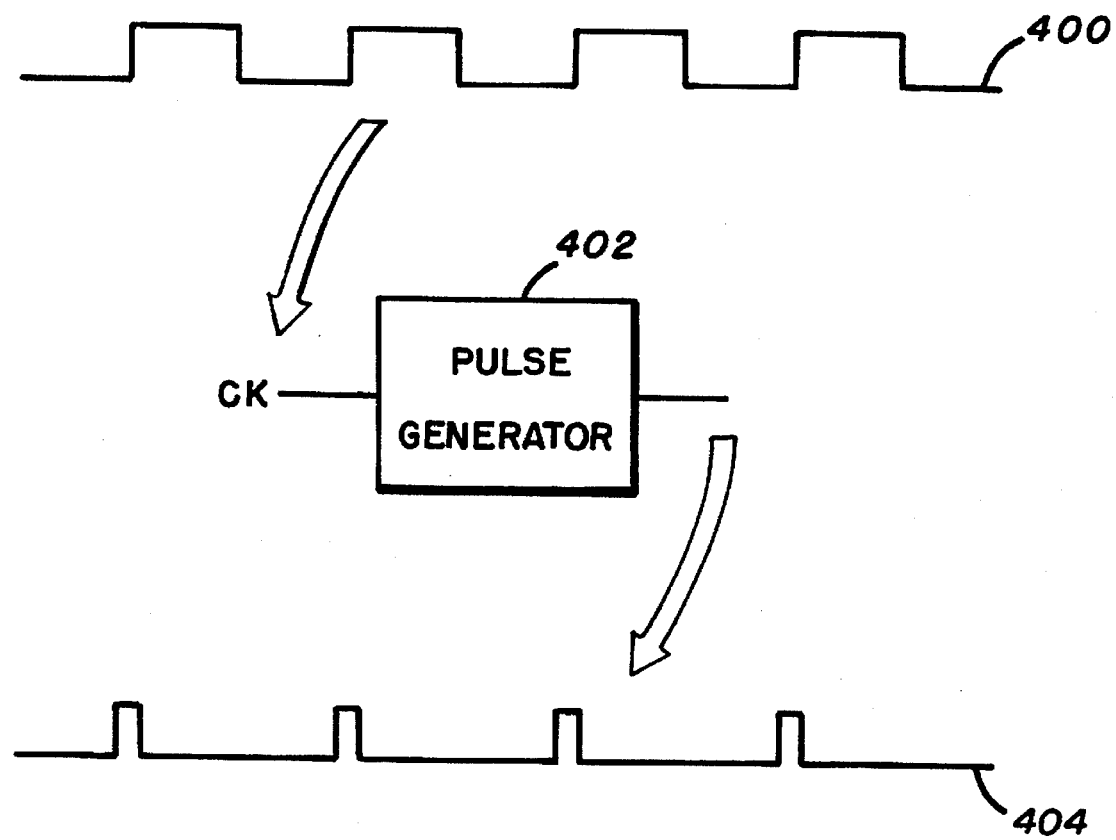
FIG. 4 illustrates signals and components utilized to provide a D-type flip-flop mode of operation.

A selection of a latch mode or a D-type flip-flop mode of operation may be provided using a latch, similar to the latch shown in FIG. 2. To provide a latch mode of operation, a direct clock signal 400, as shown in FIG. 4, may be applied to the clock input of the latch. To provide a D-type flip-flop mode of operation, the clock signal 400 may then be provided through a pulse generator 402, the pulse generator 402 providing narrow pulses 404 occurring at the leading edge of pulses of clock signal 400, as shown in FIG. 4. The narrow pulses 404 from the pulse generator applied to the clock input of a latch enable the latch to transition substantially only during the leading edges of pulses of clock signal 400.

A conventional D-type flip-flop typically provides edge sensitivity such that an input data signal is provided at a Q output of the D-type flip-flop only at one edge of a clock pulse, depending on an input data signal state before transition of a clock pulse edge. Metastability defines a state for a D-type flip-flop where a glitch occurs and the D-type flip-flop does not accurately provide such a Q output at the edge of a clock pulse. Register stability is determined by the difficulty for a particular register to enter a metastable state and the difficulty for the particular register to recover from the metastable state.

Figure 5:
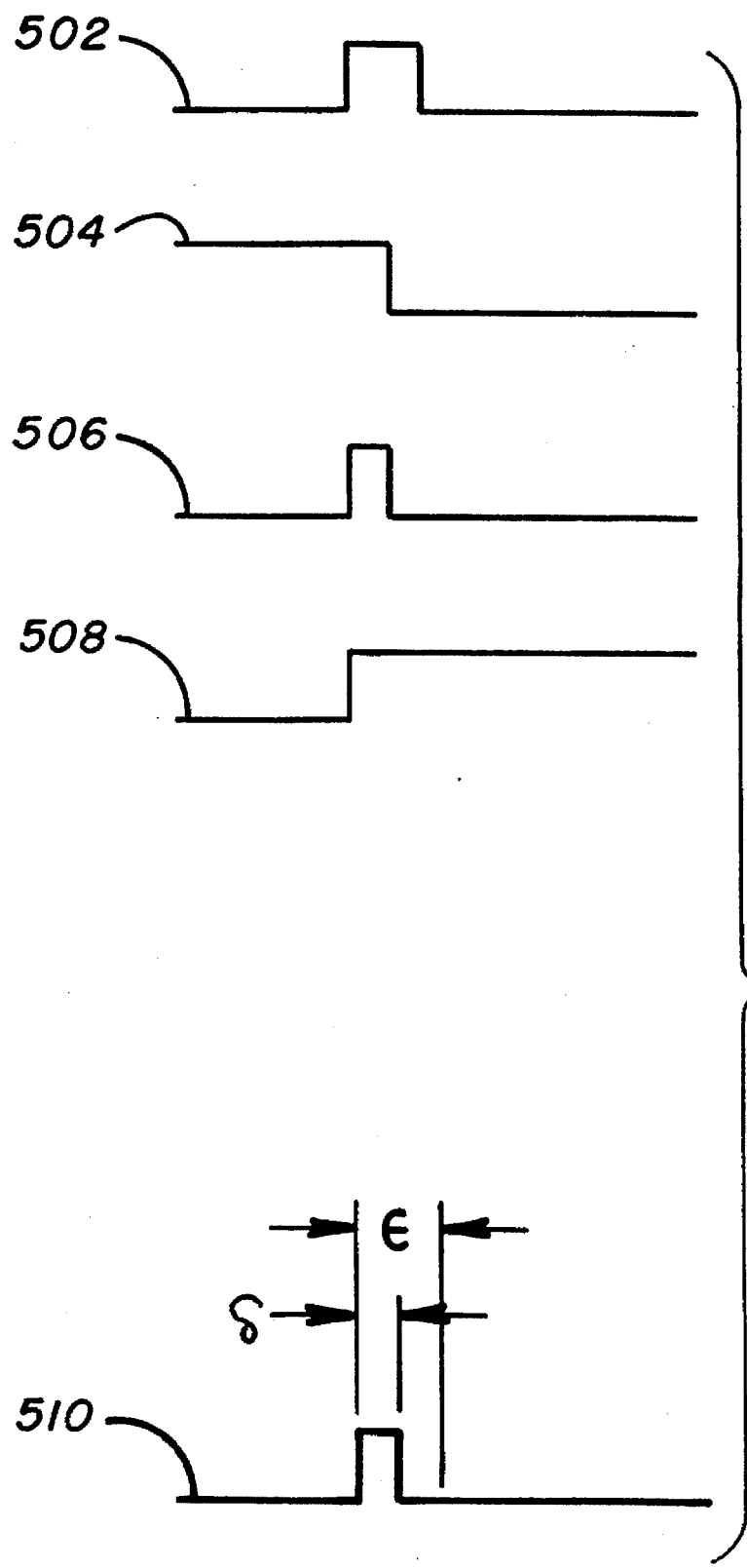
FIG. 5 shows signals illustrating a glitch occurring in a typical latch design receiving a D-type flip-flop mode signal as illustrated in FIG. 4.

With pulses 404, however, having a pulse width long enough to assure an input data signal is properly latched, when the input data signal changes states while a clock pulse is provided from a pulse generator, metastability, or an error can occur as illustrated in FIG. 5.

As shown in FIG. 5, with a clock pulse 502 from a pulse generator applied to the clock input of a latch along with a data signal 504 applied to its data input, a glitch signal such as 506 can be generated from the Q output of the latch creating a metastable state. The signal 506 occurs because the signal 502 is changing during application of the pulse signal 504. For a conventional D-type flip-flop configuration with an input data signal 504 having an edge corresponding with application of pulse 502, the output of the D-type flip-flop is shown at 508.

To provide the function similar to a D-type flip-flop while avoiding matastability as described with respect to the signals of FIG. 5, a P-type flip-flop may be utilized instead of a latch. In the present invention, a P-type flip-flop is defined wherein its output will change states to follow its data input at a leading edge of its clock input, then does not change states for a period ϵ, and then its output will change states to match its data input after the period ϵ if a signal received at the clock input has a pulse period greater than ϵ. As illustrated by line 510 of FIG. 5, the period ϵ is set to be slightly greater than the period δ of a clock pulse generated by a pulse generator 402 utilized to provide a D-type flip-flop mode signal.

Figure 6:
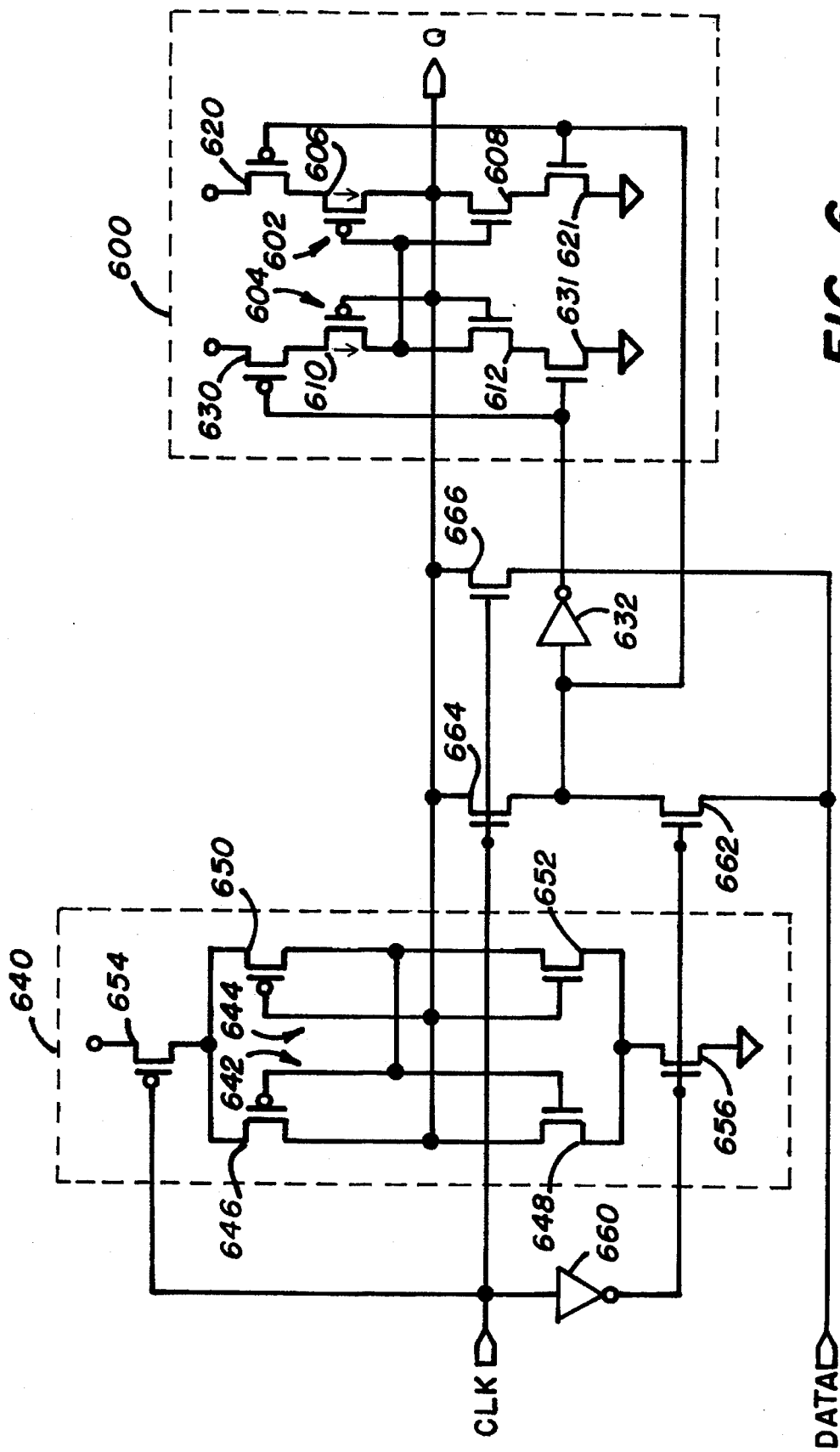
FIG. 6 shows an embodiment of a P-type flip-flop of the present invention.

FIG. 6 shows an embodiment of a P-type flip-flop of the present invention. The circuit includes a first regenerative latch 600 made up of a first inverter 602 having an input forming the P-type flip-flop Q output, and an output, and a second inverter 604 having an input connected to the first inverter output and an output connected to the first inverter input. The first inverter 602 includes a PMOS pull up transistor 606 and an NMOS pull down transistor 608 with source to drain paths connected together on one end forming the P-type flip-flop Q output, and gates connected together. The second inverter is made up of a PMOS pull up transistor 610 and an NMOS pull down transistor 612 with source to drain paths connected together on one end and to the input of inverter 602, and gates connected together and to the output of inverter 602.

The first regenerative latch 600 further includes enabling circuitry, including a first pair of PMOS and NMOS transistors, 620 and 621, and a second pair of PMOS and NMOS transistors 630 and 631. PMOS transistor 620 has a source to drain path connecting the source of PMOS transistor 606 to Vcc. NMOS transistor 621 has a source to drain path connecting the source of NMOS transistor 608 to Vss. The gates of transistors 620 and 621 are connected together. PMOS transistor 630 has a source to drain path connecting the source of PMOS transistor 610 to Vcc. NMOS transistor 631 has a source to drain path connecting the source of transistor 612 to Vss. The gates of transistors 630 and 631 are connected together. The gates of transistors 620 and 621 are connected to the gates of transistors 630 and 631 through an inverter 632.

The circuit of FIG. 6 additionally includes a second latch 640 including a third inverter 642 having an input connected to the storage element Q output, and a fourth inverter 644 having an input connected to the third inverter 642 output and an output connected to the third inverter 642 input. The third inverter 642 includes a PMOS pull up transistor 646 and an NMOS pull down transistor 648 with source to drain paths connected together and to the storage element Q output. The fourth inverter is made up of a PMOS pull up transistor 650 and an NMOS pull down transistor 652 with source to drain paths connected together on one end and to the input of third inverter 642, and gates connected together and to the output of third inverter 642.

The second latch 640 further includes enabling circuitry including a PMOS transistor 654, and an NMOS transistor 656. PMOS transistor 654 has a source to drain path connecting the source of PMOS transistors 646 and 650 to Vcc. NMOS transistor 656 has a source to drain path connecting the source of NMOS transistors 648 and 652 to Vss. The gate of transistor 654 is connected to the clock input of the P flip-flop. The gate of transistor 656 is coupled to the clock input of the P flip-flop through a timing inverter 660.

The output of timing inverter 660 is further connected to a pass gate transistor 662. The pass gate 662 has a source to drain path connecting the P flip-flop data input to the gates of transistors 620 and 621. The P flip-flop clock input is connected directly to the gate of an additional pass gate 664. The pass gate 664 has a source to drain path connecting the P flip-flop Q output to the gates of transistors 620 and 621. An additional pass gate 666 has a gate connected directly to the P flip-flop clock input. The pass gate 666 has a source to drain path connecting the P flip-flop data input to the P flip-flop Q output.

In operation, it is first assumed that the clock signal (CLK) is low. With CLK low, transistors 654 and 656 turn on to enable inverters 642 and 644 causing latch 840 to latch the current state of the Q output of the P flip-flop. With the clock input signal low, transistors 664 and 666 remain off so that a changing signal (DATA) at the data input of the P-type flip-flop signal does not effect the state of the P flip-flop Q output.

Further with clock low, transistor 662 is on so that the DATA signal state controls turn on or turn off of transistors 620, 621, 630 and 631 which supply power to the regenerative latch 600. The state of transistors 620, 621, 630 and 631 then make transition of the P-type flip-flop Q output to match the state of the DATA signal rapid when the CLK signal goes high. The state of transistors 620, 621, 630 and 631 will also resist change in the Q output should the DATA signal change states after the CLK signal goes high.

When the CLK signal goes high, transistors 654 and 656 turn off to disable inverters 642 and 644, disabling latch 640. Further, transistors 664 and 666 turn on. Transistor 666 will then carry the DATA signal to the Q output.

If the DATA signal changes states up to a time slightly before transition of CLK to high, because of the delay of the CLK signal change through inverter 660, transistor 662 will still be on to enable the states of transistors 620, 621, 630 and 631 to be preset to conform with the DATA signal. Thus, once CLK goes high, the preset states of transistors 620, 621, 630 and 631 will enable the Q output to rapidly change states to conform with the DATA signal provided through transistors 666.

If the DATA signal changes state slightly after transition of CLK to high, transistor 662 will be off and the preset states of transistors 620 and 621 in conjunction with transistors 606 and 608 will resist a change in the Q output. The DATA signal does pass through transistor 664 to enable the states of transistors 620, 621, 630 and 631 to be reset, but transistors 620, 621, 606 and 608 are sized larger relative to transistor 666 so that the Q output will not change states if the DATA signal changes states immediately after CLK goes high for a period ϵ.

The period ε is determined by the sizing of transistors 664, 620 and 621 and will also depend on capacitance on inverter 632. Therefore, as transistor 664 is weaker, the period ε will be longer. Likewise, transistors 620 and 621 being larger will increase delay.

Figure 7:
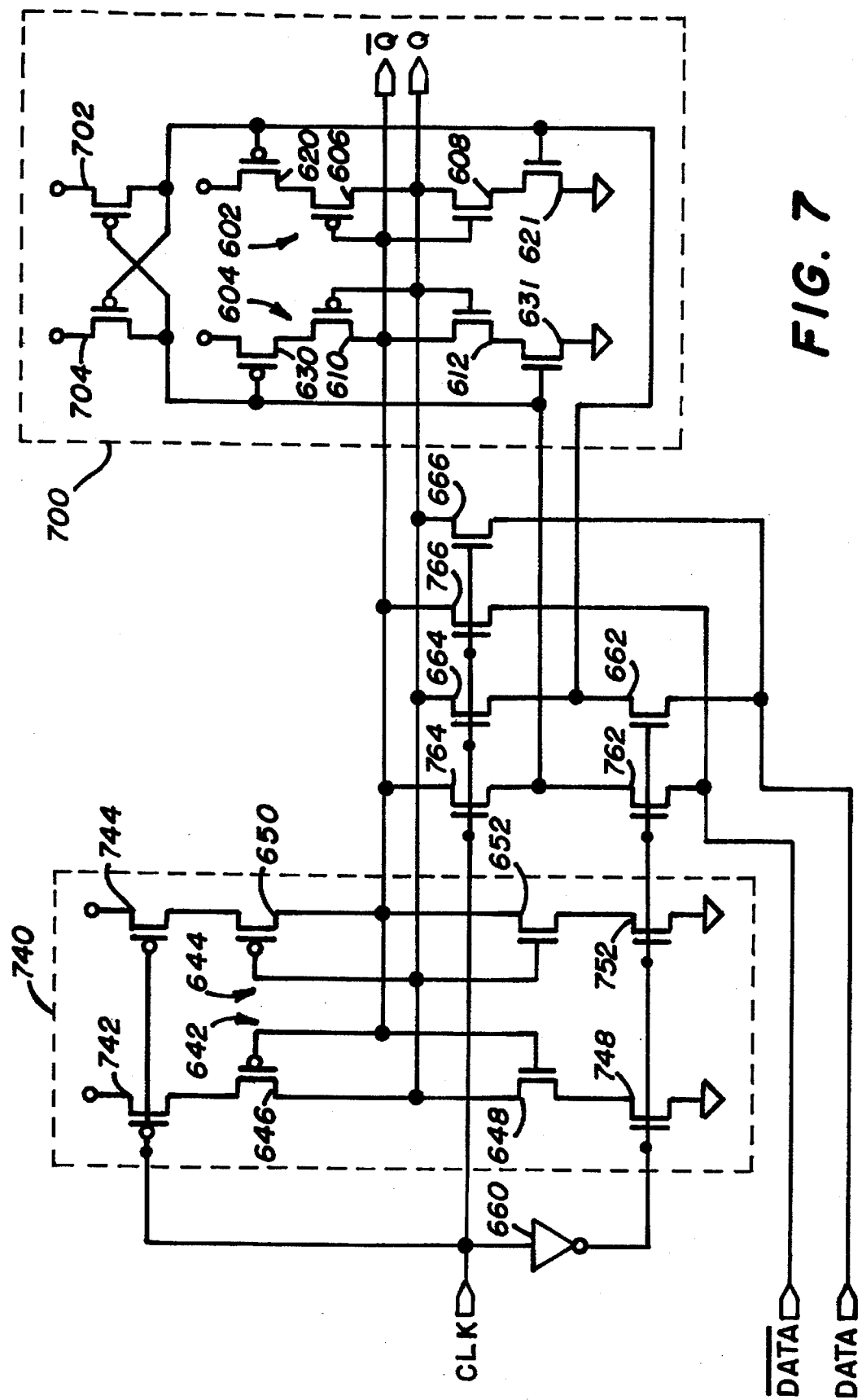
FIG. 7 shows modifications to the circuitry of FIG. 6 to remove gate delays and increase circuit switching speed.

FIG. 7 shows modifications to the circuitry of FIG. 6 to remove gate delays and increase circuit switching speed. Note that circuit components carried forward from FIG. 6 are similarly labeled in FIG. 7, as will be circuit components carried forward in subsequent figures.

The circuit of FIG. 7 includes a first latch 700, similar to the first latch 600 of FIG. 6, but with additional transistors 702 and 704. Transistor 702 has a gate connected to the gates of transistors 603 and 631 and a source to drain path connecting Vcc to the gates of transistors 620 and 621. Transistor 704 has a gate connected to the gates of transistors 620 and 621 and a source to drain path connecting Vcc to the gates of transistors 630 and 631. In operation, transistors 702 and 704 serve to increase the switching speed of transistors 620, 621, 630 and 631 by supplying additional current to the gates of transistors 620, 621, 630 and 631 which receive a high gate signal.

The circuit of FIG. 7 further includes a second latch 740, similar to the second latch 640 of FIG. 6, but with transistor 654 replaced by transistors 742 and 744 and transistor 656 replaced by transistors 748 and 752. As with transistor 654, transistors 742 and 744 have gates connected to the P flip-flop clock input. However, unlike transistor 654, transistor 742 has a source to drain path individually connecting Vcc to the source of transistor 642, while transistor 744 has a source to drain path connecting Vcc to the source of transistor 650. Similarly, as with transistor 656, transistors 748 and 752 have gates connected to the output of timing inverter 660. Further, unlike transistor 656, transistor 746 has a source to drain path connecting Vss to the source of transistor 648, while transistor 752 has a source to drain path connecting Vss to the source of transistor 652. In operation, by individually connecting transistors 642 and 644 to Vcc and transistors 648 and 652 to Vss, the layout is more compact.

Instead of including an inverter 632 which provides a significant gate delay, the circuitry of FIG. 7 is modified to eliminate inverter 632. To enable elimination of inverter 632, transistors 762, 764 and 766 are added to the circuit of FIG. 6 and the DATA signal is received along with its complement $\overline{DATA}$. Transistor 762 has its gate connected to the output of timing inverter 660 and a source to drain path connecting the $\overline{DATA}$ signal to the gates of transistors 631 and 632. Transistor 764 has its gate connected to the P flip-flop clock input and a source to drain path connecting the input of inverter 602 to the gates of transistors 631 and 630. Transistor 766 has its gate connected to the P flip-flop clock input and a source to drain path connecting the $\overline{DATA}$ signal to the input of inverter 602. In operation, the circuitry of FIG. 7 functions similar to the circuit of FIG. 6, with transistors 762 and 764 providing the connection to the gates of transistors 630 and 631 previously provided by inverter 632.

Because inverter 632 is so replaced, the period ε is now determined by the RC delay resulting from the size of transistor 664 in combination with transistors 620 and 621, as well as the delay of transistor 764 and the size of transistors 630 and 631.

Figure 8:
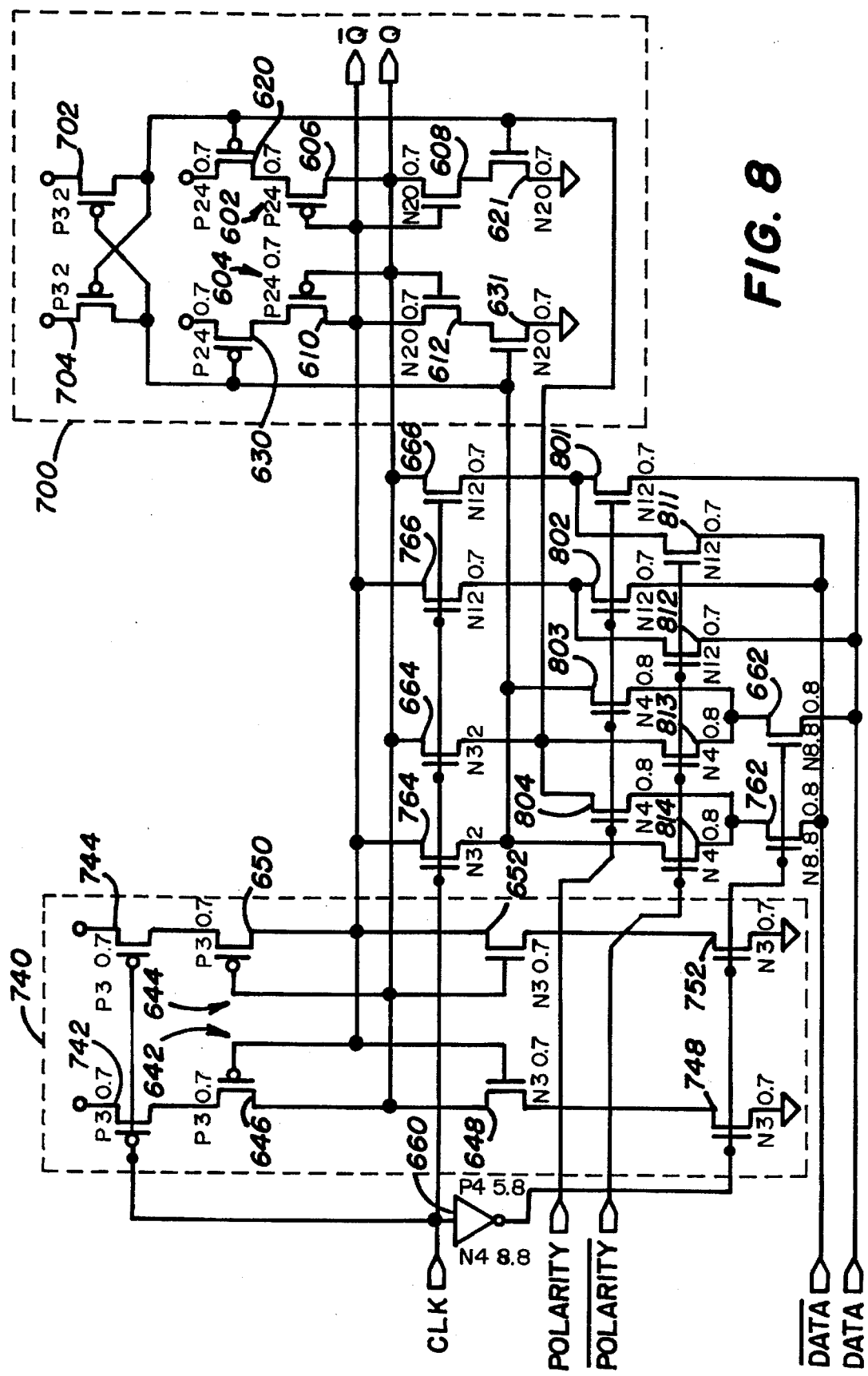
FIG. 8 shows modifications to the circuitry of FIG. 8 to provide a P-type flip-flop which also provides the function of an exclusive OR gate.

FIG. 8 shows modifications to the circuitry of FIG. 7 to provide a P flip-flop to provide specific polarity selection without acquiring any additional gate delays. For the transistors shown in FIG. 8, a suggested channel type and transistor dimensions are indicated next to the transistor with a p or n indicating channel type followed by channel width and length in microns. For logic gates such as inverter 660, channel type and dimensions for each transistor are included with the gate logic symbol. Transistor sizes and types are only suggested and may be changed to meet particular design requirements.

To provide the function of an exclusive OR gate, the circuit of FIG. 8 receives a polarity signal (POLARITY), along with its inverse ($\overline{POLARITY}$), wherein when the POLARITY signal is high, the circuit behaves similar to the circuit of FIG. 7, but with POLARITY low, the circuitry of FIG. 8 behaves as if DATA and $\overline{DATA}$ were interchanged.

To provide the function of an exclusive OR gate using the POLARITY and $\overline{POLARITY}$ signals as described, the circuit of FIG. 8 adds transistors 801–804 and 811–814. Transistors 801–804 have gates connected to receive the POLARITY signal, while transistors 811–814 have gates connected to receive the $\overline{POLARITY}$ signal. The source to drain path of transistor 801 connects the source of transistor 666 to receive the DATA signal, while the source to drain path of transistor 811 connects the source of transistor 666 to receive the $\overline{DATA}$ signal. The source to drain path of transistor 802 connects the source to transistor 766 to receive the $\overline{DATA}$ signal, while the source to drain path of transistor 812 connects the source of transistor 766 to receive the DATA signal. The source to drain path of transistor 803 connects the gates of transistors 630 and 631 to the drain of transistor 662, while the source to drain path of transistor 813 connects the gates of transistors 620 and 621 to the drain of transistor 662. The source to drain path of transistor 804 connects the gates of transistors 620 and 621 to the drain of transistor 762, while the source to drain path of transistor 814 connects the gates of transistors 630 and 631 to the drain of transistor 762.

Figure 9A:
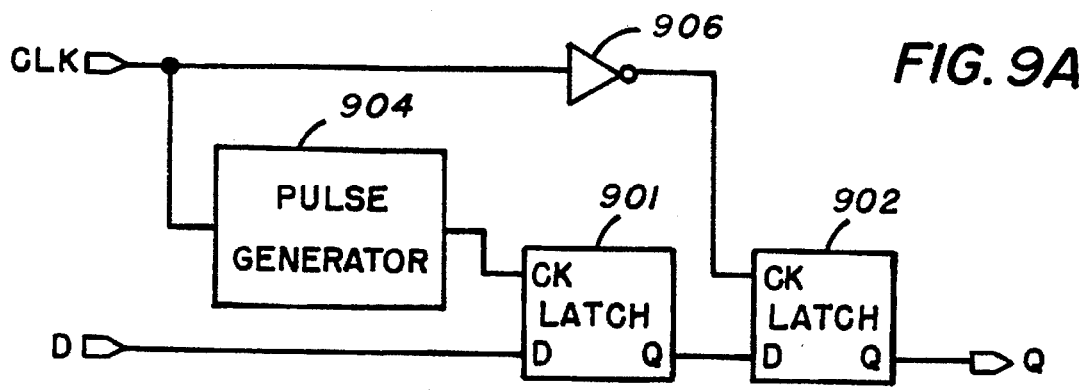
FIG. 9A shows another embodiment of a P-type flip-flop of the present invention.

FIG. 9A shows another embodiment of a storage element of the present invention configured to operate as a P-type flip-flop. The circuitry of FIG. 9A includes two latches 901 and 902, a pulse generator 904 and an inverter 906. The data input of the P flip-flop is received at the data input of latch 901. Further, the clock input of the P flip-flop is received at the input of pulse generator 904 and the input of inverter 906. The output of pulse generator 904 is provided to the clock input of latch 901, while the output of inverter 906 is connected to the clock input of latch 902. The Q output of latch 901 is provided to the data input of latch 902, while the Q output of latch 902 is provided as the P flip-flop output.

Latches 901 and 902 are configured so that when a clock signal (CK) is received in a low state, the storage element is transparent, providing its data input (D) directly to its (Q) output. Further, latches 901 and 902 are configured so that when a clock signal is received in a high state, the storage element latches the previous state of its Q output when the clock signal was in the low state.

Pulse generator 904 is configured so that it provides a pulse when its input transitions from the low state to the high state, the pulse period having a pulse width ε.

Figure 9B:
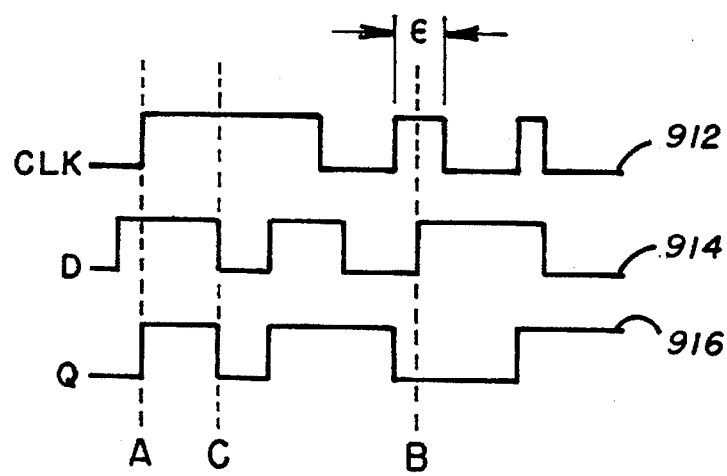
FIG. 9B shows timing diagrams for the circuitry of FIG. 9A.

Timing diagrams shown in FIG. 9B show a respective clock input signal 912 and data input 914 to the P flip-flop of FIG. 9A along with a Q output signal 916. As illustrated at dashed line A, for the data signal 914 transitioning and remaining in one state prior to the clock signal 912 transitioning to high, the Q output signal 916 will also transition to match the input data signal when the clock signal goes high. However, if the data signal 914 transitions after the clock signal transitions to high and during any time ε thereafter, the Q output will not transition, as illustrated at dashed line B. After the period ε, if the clock input remains high, the Q output will transition to the state of the data input, as illustrated at dashed line C.

Figure 9C:
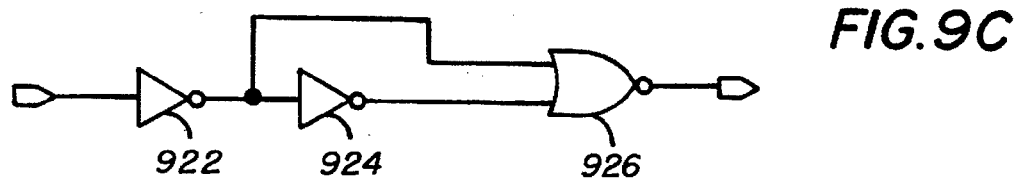
FIG. 9C shows circuitry for a pulse generator which may be utilized in the circuit of FIG. 9A.

FIG. 9C shows circuitry for a pulse generator which may be utilized as pulse generator 904. As shown, the pulse generator includes series inverter 922 and 924. The input of inverter 922 is connected to the input of inverter 924, and the outputs of inverter 922 and 924 provide inputs to NOR gate 926. The input of inverter 922 forms the pulse generator input and the output of NOR gate 926 provides the pulse generator output. The inverter 924 has a delay equal to ε which sets the pulse period of a signal provided at the output of the pulse generator to ε. Utilizing a NOR gate, the pulse generator provides a high output pulse when the pulse generator input transitions from low to high.

Figure 9D:
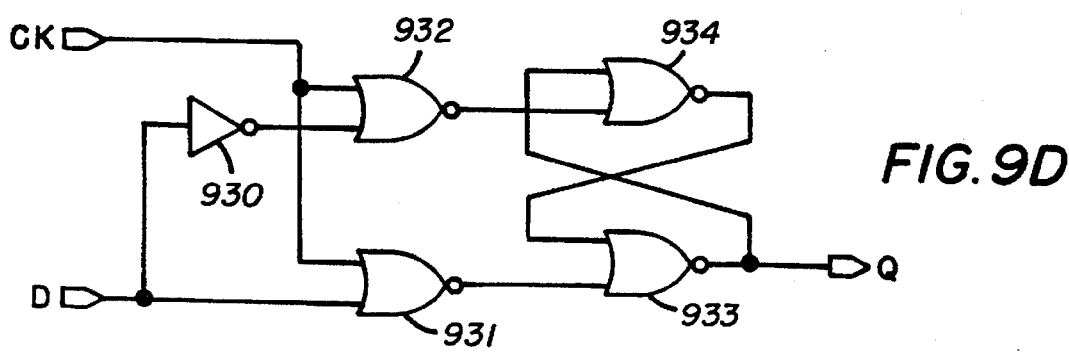
FIG. 9D shows circuitry for a latch which may be utilized in the circuit of FIG. 9A.

FIG. 9D shows circuitry for a latch which may be utilized for each of latches 901 and 902. As shown, the latch includes an inverter 930 and four NOR gates 931, 932, 933 and 934. The data input (D) of the latch is provided to a first input of NOR gate 931 and through inverter 930 to a first input of NOR gate 932. The clock input (CLK) is provided to second inputs of NOR gates 931 and 932. Outputs of NOR gates 931 and 932 are provided to respective first inputs of NOR gates 933 and 934. The second input of NOR gate 933 is connected to the output of NOR gate 934, while the second input of NOR gate 934 is connected to the output of NOR gate 933 which further forms the Q output of the latch. Utilizing NOR gates, when the CLK signal is low, the Q output follows the D signal, but when the CLK signal is high, the Q output maintains its previous state.

The P-type flip-flop, as described above, can reduce circuitry and chip space required for providing a circuit with a selectable latch or D-type flip-flop mode of operation. The P-type flip-flop may be useful in a variety of devices such as microprocessors, field programmable gate arrays (FPGAs), or programmable logic devices PLD. Specific use of a P-type flip-flop in a PLD is described in U.S. patent application Ser. No. 08/458,865, entitled "Macrocell And Clock Signal Allocation Circuit For A Programmable Logic Device (PLD) Enabling PLD Resources To Provide Multiple Functions", filed Jun. 2, 1995, and incorporated herein by reference.

Although the invention has been described above with particularity, this was merely to teach one of ordinary skill in the art how to make and use the invention. Many modifications will fall within the scope of the invention, as that scope is defined by the claims which follow.

What is claimed is:

1. A P-type flip-flop having a clock input, a data input and an output comprising:

means for changing states of the output of the P flip-flop to match the data input at a leading edge of a pulse of a given signal having a pulse width δ which is received at the clock input of the P flip-flop; and means for preventing the output of the P flip-flop from changing states for a period ε after the reading edge of the pulse of the given signal is received, where ε is greater than δ, and for enabling the output of the P flip-flop to change states to match the data input after the period ε as long as the given signal has a period greater than ε.

2. The P flip-flop of claim 1 wherein the means for changing states of the output of the P flip-flop comprises:

a first inverter having an input forming the P flip-flop output, and an output, the first inverter including a pull up transistor and a pull down transistor with source to drain paths connected to the first inverter input and gates connected to the first inverter output;

a second inverter having an input connected to the output of the first inverter and an output connected to the input of the first inverter, the second inverter including a pull up transistor and a pull down transistor with source to drain paths connected to the second inverter input and gates connected to the second inverter output;

a first pair of transistors including PMOS and NMOS transistors having gates connected together, a first one of the first pair of transistors having a source to drain path connecting the pull up transistor of the first inverter to Vdd, and a second one of the first pair of transistors having a source to drain path connecting the pull down transistor of the first inverter to Vss;

a second pair of transistors including PMOS and NMOS transistors having gates connected together, a first one of the second pair of transistors having a source to drain path connecting the pull up transistor of the second inverter to Vdd, and a second one of the first pair of transistors having a source to drain path connecting the pull down transistor of the second inverter to Vss;

a third inverter having an output connected to the P flip-flop output and an input, the third inverter including a pull up transistor and a pull down transistor with source to drain paths having first ends connected together forming the third inverter output and gates connected together forming the third inverter input;

a fourth inverter having an input connected to the output of the third inverter, the fourth inverter including a pull up transistor and a pull down transistor with source to drain paths connected on a first end forming the fourth inverter output and gates connected together forming the fourth inverter input;

a PMOS transistor means having a gate connected to receive the first clock signal, and a source to drain path connecting the source to drain path of the pull up transistors of the third and fourth inverters to Vdd;

an NMOS transistor means having a gate, and a source to drain path connecting the source to drain path of the pull down transistors of the third and fourth inverters to Vss;

a timing inverter having an input connected to receive the first crock signal and an output connected to the gate of the NMOS transistor;

a clock pass gate means having a current control input forming the clock input of the P flip-flop connected to receive the first clock signal, and a current path having a first end connected to the output of the P flip-flop for receiving a P flip-flop output signal, and a second end providing the P flip-flop output signal to the gates of the first pair of transistors and providing a complement of the P flip-flop output signal to the gates of the second pair of transistors; and a first data pass gate having a gate connected to the clock input of the P flip-flop, and a source to drain path with a first end coupled to the data input of the P flip-flop, and a second end connected to the output of the P flip-flop, and wherein the means for preventing the P flip-flop from changing states comprises:

a timing inverter pass gate means having a current control input connected to the output of the timing inverter and a current path having a first end forming the data input of the P flip-flop for receiving the data signal, and a second end providing the data signal to the gates of the first pair of transistors and providing a complement of the data signal to the gates of the second pair of transistors as controlled by the current control input.

3. The P flip-flop of claim 2 wherein, the clock pass gate means comprises:

a first clock pass gate having a gate connected to the clock input of the P flip-flop, and a source to drain path having a first end connected to the P flip-flop output, and a second end connected to the gates of the first pair of transistors; and a second clock pass gate having a gate connected to the clock input of the P flip-flop, and a source to drain path having a first end connected the output of the first inverter, and a second end connected to the gates of the second pair of transistors.

4. The P flip-flop of claim 3 wherein the data signal includes a true data signal and a complement data signal which is inverted from the true data signal, a polarity signal, and a complement polarity signal which is inverted from the inverse polarity signal, wherein the P-flip-flop further comprises:

a first polarity pass gate having a gate connected to receive the polarity signal and a source to drain path connecting the true data signal to the source to drain path of the first data pass gate;

a second polarity pass gate having a gate connected to receive the complement polarity signal and a source to drain path connecting the complement data signal to the source to drain path of the data pass gate;

a second data pass gate having a gate connected to receive the clock signal and a source to drain path with a first end connected to the output of the first inverter and a second end;

a third polarity pass gate having a gate connected to receive the polarity signal and a source to drain path connecting the complement data signal to the second end of the source to drain path of the second data pass gate; and a fourth polarity pass gate having a gate connected to receive the inverse polarity signal and a source to drain path connecting the data signal to the second end of the source to drain path of the second data pass gate, and wherein the timing inverter pass gate means comprises:

a first timing inverter pass gate having a gate connected to the output of the timing inverter and a source to drain path having a first end receiving the data signal and a second end;

a fifth polarity pass gate having a gate connected to receive the polarity signal and a source to drain path connecting the second end of the first timing inverter pass gate to the gates of the first pair of transistors;

a sixth polarity pass gate having a gate connected to receive the complement polarity sinal and a source to drain path connecting the second end of the first timing inverter pass gate to the gates of the second pair of transistors;

a second timing inverter pass gate having a gate connected to the output of the timing inverter and a source to drain path having a first end receiving the complement data signal and a second end;

a seventh polarity pass gate having a gate connected to receive the complement polarity signal and a source to drain path connecting the second end of the second timing inverter pass gate to the gates of the first pair of transistors; and an eighth polarity pass gate having a gate connected to receive the polarity signal and a source to drain path connecting the second end of the second timing inverter pass gate to the gates of the second pair of transistors.

5. The P flip-flop of claim 2 wherein the PMOS transistor means comprises:

a first PMOS transistor having a gate connected to receive the first clock signal, and a source to drain path connecting the source to drain path of the pull up transistor of the third inverter to Vdd; and a second PMOS transistor having a gate connected to receive the first clock signal, and a source to drain path connecting the source to drain path of the pull up transistor of the fourth inverter to Vdd, and wherein the NMOS transistor means comprises:

a first NMOS transistor having a gate connected to the output of the timing inverter, and a source to drain path connecting the source to drain path of the pull down transistor of the third inverter to Vss; and a second NMOS transistor having a gate connected to the output of the timing inverter, and a source to drain path connecting the source to drain path of the pull down transistor of the fourth inverter to Vss.

6. The P-type flip-flop of claim 1 wherein the means for changing states of the output of the P flip-flop comprises:

first and second latches, each having a data input, a clock input and an output, wherein a signal provided to the data input of a given one of the latches is provided to its output when a first voltage state is received at its clock input, and wherein the signal provided to the data input of the given latch is prevented from being provided to its output when a second voltage state is received at its clock input, wherein the data input of the first latch forms the data input of the P flip-flop, and wherein the output of the first latch is connected to the data input of the second latch, wherein the output of the second latch forms the output of the P flip-flop, and wherein the clock input of the P flip-flop is coupled to the clock input of the first latch; and an inverter having an input forming the P flip-flop clock input, and an output connected to the clock input of the second latch element, and wherein the means for preventing the P flip-flop from changing states comprises:

a P flip-flop pulse generator coupling the clock input of the P flip-flop to the clock input of the first latch, an output of the pulse generator providing a pulse at a leading edge of a signal transitioning from the second state to the first state when the signal is received at an input of the pulse generator, the pulse having the period $\epsilon$.

7. The P-type flip-flop of claim 6 wherein the first and second latches each comprise:

an inverter having an input connected to the data input of its respective latch, and an output;

a first NOR gate having a first input connected to the data input of its respective latch, a second input connected to the clock input of its respective latch and an output;

a second NOR gate having a first input connected to the output of the inverter, a second input connected to the clock input of its respective latch and an output;

a third NOR gate having a first input connected to the output of the first NOR gate, a second input, and an output connected to the output of its respective latch; and a fourth NOR gate having a first input connected to the output of the second NOR gate, a second input connected to the output of the third NOR gate, and an output connected to the second input of the third NOR gate.

8. The P-type flip-flop of claim 6 wherein the P flip-flop pulse generator means comprises:

a first inverter having an input forming the input of the P flip-flop pulse generator and an output;

a second inverter having an input connected to the output of the first inverter and an output, the second inverter having a delay equal to the period $\epsilon$; and a NOR gate having a first input connected to the input of the second inverter, a second input connected to the output of the second inverter and an output forming the output of the P flip-flop pulse generator.

\* \* \* \* \*